(12) United States Patent
Nishida

(10) Patent No.: US 8,035,114 B2
(45) Date of Patent: Oct. 11, 2011

(54) INTEGRATION OF A LIGHT EMITTING DEVICE AND A PHOTODETECTOR WITH AN ISOLATION STRUCTURE FORMED THEREBETWEEN

(75) Inventor: Tetsuo Nishida, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 722 days.

(21) Appl. No.: 11/745,696

(22) Filed: May 8, 2007

(65) Prior Publication Data
US 2007/0286249 A1 Dec. 13, 2007

(30) Foreign Application Priority Data
May 26, 2006 (JP) ................... 2006-146545

(51) Int. Cl.
*H01L 27/15* (2006.01)
*H01L 29/26* (2006.01)
*H01S 5/00* (2006.01)

(52) U.S. Cl. .............. 257/80; 257/82; 257/E31.096; 372/50.21; 372/50.124

(58) Field of Classification Search .............. 372/50.21, 372/50.124; 257/82, E31.096
See application file for complete search history.

(56) References Cited

U.S. PATENT DOCUMENTS

| | | | | |
|---|---|---|---|---|
| 4,717,678 A | * | 1/1988 | Goth | 438/372 |
| 4,757,032 A | * | 7/1988 | Contiero | 438/268 |
| 5,606,572 A | * | 2/1997 | Swirhun et al. | 372/96 |
| 5,652,450 A | * | 7/1997 | Hirano | 257/323 |
| 6,483,862 B1 | * | 11/2002 | Aronson et al. | 372/50.21 |
| 6,803,604 B2 | | 10/2004 | Takahashi et al. | |
| 7,242,704 B2 | | 7/2007 | Kaneko | |
| 2006/0054899 A1 | | 3/2006 | Takahashi et al. | |

FOREIGN PATENT DOCUMENTS

| | | |
|---|---|---|
| JP | A 10-135568 | 5/1998 |
| JP | A 2002-504754 | 2/2002 |
| JP | A 2003-202529 | 7/2003 |
| JP | A 2005-197513 | 7/2005 |
| WO | WO 99/43056 A1 | 8/1999 |

* cited by examiner

*Primary Examiner* — Lynne Gurley
*Assistant Examiner* — Jesse Y Miyoshi
(74) *Attorney, Agent, or Firm* — Oliff & Berridge, PLC

(57) ABSTRACT

An optical device includes: a surface-emitting type semiconductor laser section; at least one isolation section formed above the surface-emitting type semiconductor laser section; and a photodetector section formed above the isolation section, wherein the surface-emitting type semiconductor laser section includes a first mirror, an active layer formed above the first mirror and a second mirror formed above the active layer, the photodetector section includes a first contact layer, a photoabsorption layer formed above the first contact layer and a second contact layer formed above the photoabsorption layer, and the isolation section includes a first isolation layer of a conductivity type different from a conductivity type of the second mirror, and a second isolation layer formed above the first isolation layer and having a conductivity type different from the conductivity type of the first contact layer and the first isolation layer.

3 Claims, 7 Drawing Sheets

INTEGRATION OF A LIGHT EMITTING DEVICE AND A PHOTODETECTOR WITH AN ISOLATION STRUCTURE FORMED THEREBETWEEN

The entire disclosure of Japanese Patent Application No. 2006-146545, filed May 26, 2006 is expressly incorporated by reference herein.

BACKGROUND

1. Technical Field

The present invention relates to optical devices.

2. Related Art

A surface-emitting type semiconductor laser has a characteristic in which its optical output changes depending on the ambient temperature. For this reason, an optical module that uses a surface-emitting type semiconductor laser may be equipped with a photodetecting function for detecting a portion of a laser beam emitted from the surface-emitting type semiconductor laser to monitor its optical output value. For example, a photodetector device such as a photodiode may be provided on a surface-emitting type semiconductor laser, whereby a portion of a laser beam emitted from the surface-emitting type semiconductor laser can be monitored within the same device. For example, Japanese laid-open patent application JP-A-10-135568 is an example of related art.

SUMMARY

In accordance with an advantage of some aspects of the invention, it is possible to improve the reliability in optical devices that include a surface-emitting type semiconductor laser section and a photodetector section.

In accordance with an embodiment of the invention, an optical device includes: a surface-emitting type semiconductor laser section; at least one isolation section formed above the surface-emitting type semiconductor laser section; and a photodetector section formed above the isolation section, wherein the surface-emitting type semiconductor laser section includes a first mirror, an active layer formed above the first mirror and a second mirror formed above the active layer, the photodetector section includes a first contact layer, a photoabsorption layer formed above the first contact layer and a second contact layer formed above the photoabsorption layer, and the isolation section includes a first isolation layer of a conductivity type different from that of the second mirror, and a second isolation layer formed above the first isolation layer and having a conductivity type different from that of the first contact layer and the first isolation layer.

In the optical device, a large potential barrier with respect to carriers (electrons and holes) is present between the first contact layer and the second mirror. Accordingly, leak currents between the surface-emitting type semiconductor laser section and the photodetector section can be reduced, and the reliability of the optical device can be improved.

It is noted that, in descriptions concerning the invention, the term "above" may be used, for example, in a manner as "a specific member (hereafter referred to as 'B') formed 'above' another specific member (hereafter referred to as 'A')." In descriptions concerning the invention, the term "above" is used, in such an exemplary case described above, assuming that the use of the term includes a case in which "B" is formed directly on "A," and a case in which "B" is formed over "A" through another member on "A."

In accordance with another embodiment of the invention, an optical device includes: a substrate; a surface-emitting type semiconductor laser section formed above the substrate; at least one isolation section formed above the surface-emitting type semiconductor laser section; and a photodetector section formed above the isolation section, wherein the surface-emitting type semiconductor laser section includes a first mirror, an active layer formed above the first mirror and a second mirror formed above the active layer, the photodetector section includes a first contact layer, a photoabsorption layer formed above the first contact layer and a second contact layer formed above the photoabsorption layer, and the isolation section includes a first isolation layer of a conductivity type different from that of the second mirror, and a second isolation layer formed above the first isolation layer and having a conductivity type different from that of the first contact layer and the first isolation layer.

In accordance with still another embodiment of the invention, an optical device includes: a surface-emitting type semiconductor laser section; and, as viewed from the side of the surface-emitting type semiconductor laser section, at least one isolation section formed above the surface-emitting type semiconductor laser section; a photodetector section formed above the isolation section; and a substrate formed above the photodetector section, wherein the surface-emitting type semiconductor laser section includes a first mirror, an active layer formed above the first mirror and a second mirror formed above the active layer, the photodetector section includes a first contact layer, a photoabsorption layer formed above the first contact layer and a second contact layer formed above the photoabsorption layer, and the isolation section includes a first isolation layer of a conductivity type different from that of the second mirror, and a second isolation layer formed above the first isolation layer and having a conductivity type different from that of the first contact layer and the first isolation layer.

The optical device in accordance with an aspect of the embodiment of the invention may include a first electrode electrically connected to the first mirror, a second electrode electrically connected to the second mirror, a third electrode electrically connected to the first contact layer, and a fourth electrode electrically connected to the second contact layer, wherein the first electrode, the second electrode, the third electrode and the fourth electrode are electrically independent from one another.

In the optical device in accordance with an aspect of the embodiment of the invention, the first isolation layer and the first contact layer may be n-type, the second isolation layer and the second mirror may be p-type, the energy at an upper end of the valence band of the first isolation layer may be lower than the energy at an upper end of the valence band of the first contact layer, and the energy at a lower end of the conduction band of the second isolation layer may be higher than the energy at a lower end of the conduction band of a topmost layer of the second mirror.

In the optical device in accordance with another aspect of the embodiment of the invention, the first isolation layer and the first contact layer may be p-type, the second isolation layer and the second mirror may be n-type, the energy at a lower end of the conduction band of the first isolation layer may be higher than the energy at a lower end of the conduction band of the first contact layer, the energy at an upper end of the valence band of the second isolation layer may be lower than the energy at an upper end of the valence band of a topmost layer of the second mirror.

In the optical device in accordance with another aspect of the embodiment of the invention, the isolation layer may have an intrinsic semiconductor layer formed between the first isolation layer and the second isolation layer.

In the optical device in accordance with another aspect of the embodiment of the invention, the topmost layer of the second mirror, the first isolation layer, the second isolation layer and the first contact layer may be composed of AlGaAs layers, respectively, wherein an Al composition of the first isolation layer may be greater than an Al composition of the topmost layer of the second mirror, and an Al composition of the second isolation layer may be greater than an Al composition of the first contact layer.

In the invention, the Al composition of an AlGaAs layer is a composition of aluminum (Al) with respect to the III family elements (Al and Ga). In the invention, the Al composition of an AlGaAs layer ranges between 0 and 1. In other words, the AlGaAs layer may include a GaAs layer (with the Al composition being 0) and an AlAs layer (with the Al composition being 1).

In the optical device in accordance with another aspect of the embodiment of the invention, the first isolation layer and the second isolation layer may be composed of AlGaAs layers, respectively, the second mirror may include a current constricting layer obtained by oxidizing an AlGaAs layer in the second mirror from its side surface, and Al compositions of the first isolation layer and the second isolation layer may be smaller than an Al composition of the AlGaAs layer that becomes to be the current constricting layer.

DESCRIPTION OF EXEMPLARY EMBODIMENTS

Preferred embodiments of the invention are described below with reference to the accompanying drawings.

1. First, an optical device in accordance with an embodiment of the invention is described.

Figure 1:
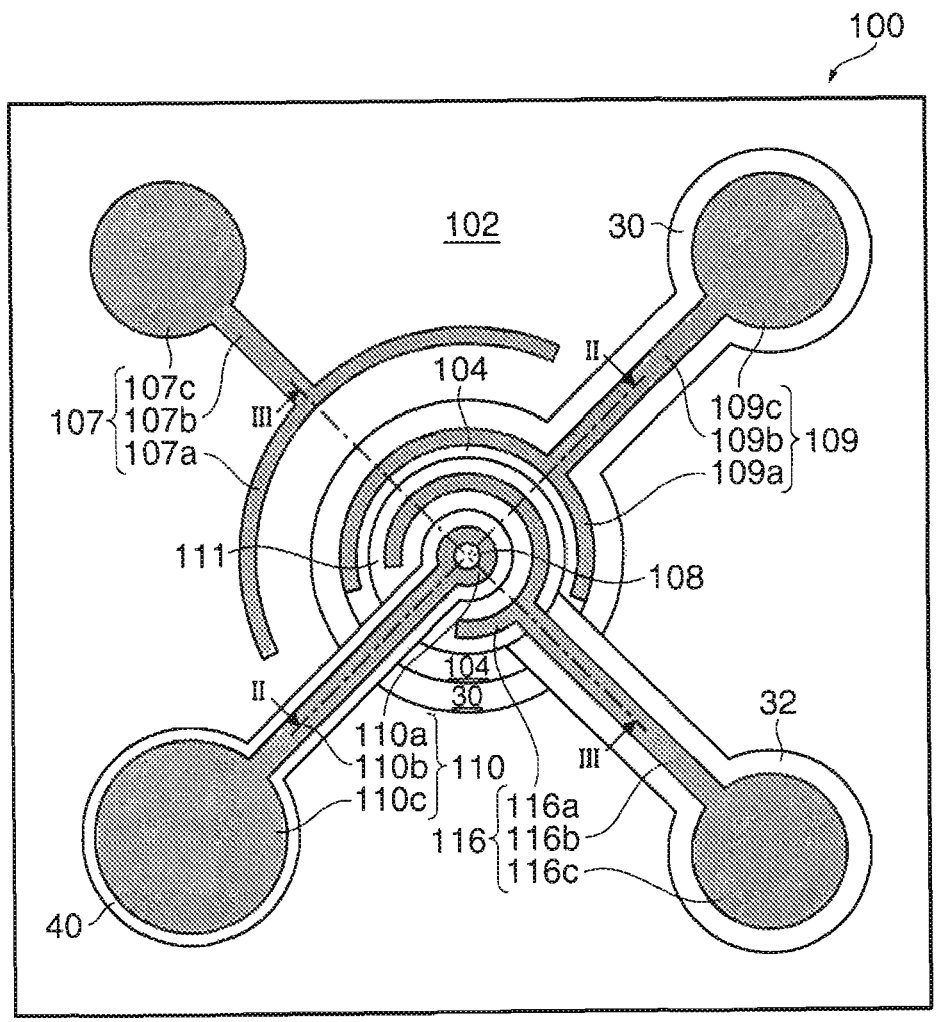
FIG. 1 is a schematic plan view of an optical device in accordance with an embodiment of the invention.
Figure 2:
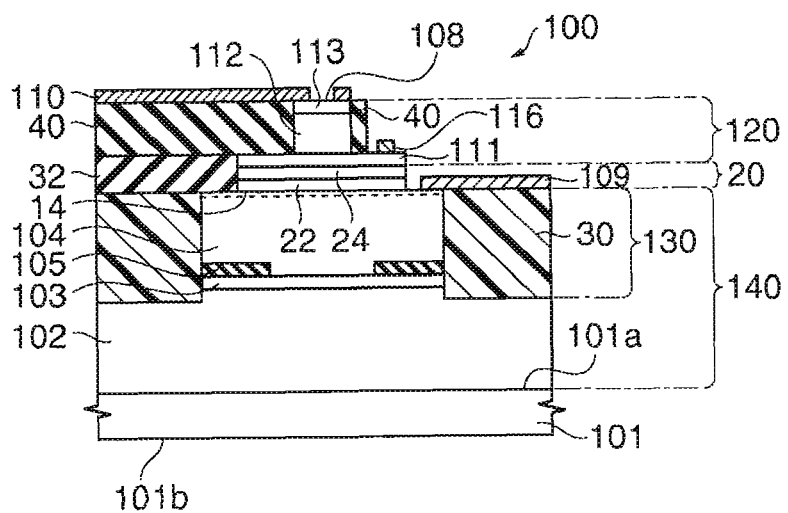
FIG. 2 is a schematic cross-sectional view of the optical device in accordance with the embodiment.
Figure 3:
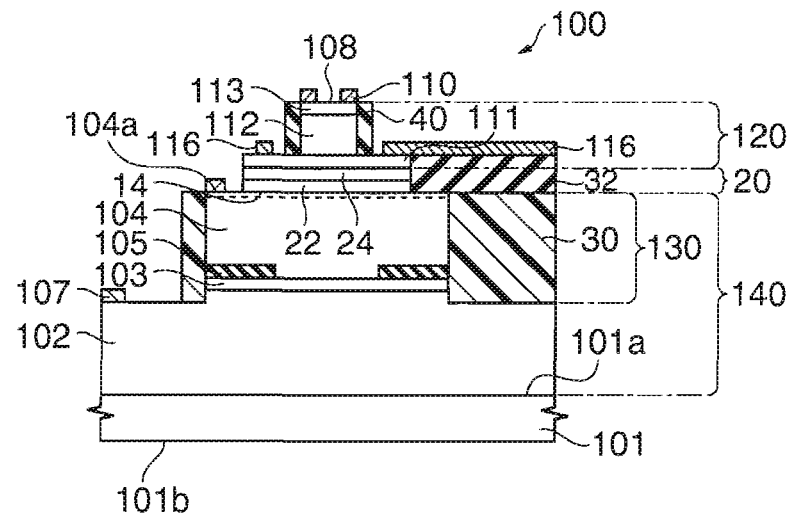
FIG. 3 is a schematic cross-sectional view of the optical device in accordance with the embodiment.

FIG. 1 schematically shows a plan view of an optical device 100, FIG. 2 is a cross-sectional view taken along a line II-II of FIG. 1, and FIG. 3 is a cross-sectional view taken along a line III-III of FIG. 1.

The optical device 100 in accordance with the present embodiment may include, as shown in FIG. 2 and FIG. 3, a substrate 101, a surface-emitting type semiconductor laser 140, an isolation section 20, a photodetector section 120, first-fourth electrodes 107, 109, 116 and 110, and first-third dielectric layers 30, 32 and 40.

As the substrate 101, for example, a GaAs substrate of a first conductivity type (for example, n-type) may be used.

The surface-emitting type semiconductor laser section 140 is formed on the substrate 101. The surface-emitting type semi-conductor laser section 140 includes a first mirror 102 of the first conductivity type (n-type), an active layer 103 formed on the first mirror 102, and a second mirror 104 of a second conductivity type (for example, p-type) formed on the active layer 103. More concretely, the first mirror 102 is, for example, a distributed Bragg reflection type (DBR) mirror of 40 pairs of alternately laminated n-type $Al_{0.9}Ga_{0.1}As$ layers and n-type $Al_{0.15}Ga_{0.85}As$ layers. The active layer 103 has a multiple quantum well (MQW) structure in which quantum well structures each formed from, for example, a GaAs well layer and an $Al_{0.3}Ga_{0.7}As$ barrier layer are laminated in three layers. The second mirror 104 includes, for example, a DBR mirror of 25 pairs of alternately laminated p-type $Al_{0.9}Ga_{0.1}As$ layers and p-type $Al_{0.15}Ga_{0.85}As$ layers, and a p-type GaAs layer (the topmost layer of the second mirror 104) 14 formed thereon. The first mirror 102, the active layer 103 and the second mirror 104 can form a vertical resonator. It is noted that the composition of each of the layers and the number of the layers composing the first mirror 102, the active layer 103 and the second mirror 104 are not particularly limited. The p-type second mirror 104, the active layer 103 that is not doped with an impurity and the n-type first mirror 102 form a pin diode. A portion of the first mirror 102, the active layer 103 and the second mirror 104 may form, for example, a columnar semiconductor laminate (hereafter referred to as a "columnar section") 130. The columnar section 130 has a plane configuration that is, for example, in a circular shape.

Also, as shown in FIG. 2 and FIG. 3, for example, at least one of the layers composing the second mirror 104 can be formed as a current constricting layer 105. The current constricting layer 105 is formed in a region near the active layer 103. As the current constricting layer 105, for example, an oxidized AlGaAs layer can be used. The current constricting layer 105 is a dielectric layer having an opening section. The current constricting layer 105 is formed in a ring shape.

The first electrode 107 is formed on a top surface of the first mirror 102. The first electrode 107 is electrically connected to the first mirror 102. The first electrode 107 may include a contact section 107a, a lead-out section 107b and a pad section 107c, as shown in FIG. 1. The first electrode 107 is in contact with the first mirror 102 at the contact section 107a. The contact section 107a of the first electrode 107 has a plane configuration that may be defined by a cut segment of a ring shape, for example, as shown in FIG. 1. The lead-out section 107b of the first electrode 107 connects the contact section 107a with the pad section 107c. The lead-out section 107b has a plane configuration that is, for example, a linear shape shown in FIG. 1. The pad section 107c of the first electrode 107 serves as an electrode pad that is connected to an external wiring or the like. The pad section 107c has a plane configuration that is, for example, a circular shape shown in FIG. 1. The first electrode 107 may be formed from a multilayer film in which, for example, layers of an alloy of gold (Au) and germanium (Ge) and gold (Au) are laminated in this order. It is noted that, in the illustrated example, the first electrode 107 is provided on the first mirror 102. However, the first electrode 107 may be provided at a back surface 101b of the substrate 101.

The second electrode 109 is formed on the second mirror 104 and the first dielectric layer 30. The second electrode 109 is electrically connected to the second mirror 104. The second electrode 109 may include a contact section 109a, a lead-out section 109b and a pad section 109c, as shown in FIG. 1. The second electrode 109 is in contact with the second mirror 104 at the contact section 109a. The contact section 109a of the second electrode 109 has a plane configuration that may be defined by a cut segment of a ring shape, for example, as shown in FIG. 1. The lead-out section 109b of the second electrode 109 connects the contact section 109a with the pad section 109c. The lead-out section 109b has a plane configuration that is, for example, a linear shape shown in FIG. 1. The pad section 109c of the second electrode 109 serves as an electrode pad that is connected to an external wiring or the like. The pad section 109c has a plane configuration that is, for example, a circular shape shown in FIG. 1. The second electrode 109 may be formed from a multilayer film in which, for example, layers of platinum (Pt), titanium (Ti) and gold (Au) are laminated in this order.

The first dielectric layer 30 is formed on the first mirror 102. The first dielectric layer 30 is formed in a manner to surround the columnar section 130. The lead-out section 109b and the pad section 109c of the second electrode 109 are formed on the first dielectric layer 30. The first dielectric layer 30 can electrically isolates the second electrode 109 from the first mirror 102. The first dielectric layer 30 may be composed of a material with which a thick film can be more readily formed, compared to the second dielectric layer 32 and the third dielectric layer 40. For example, as the first dielectric layer 30, a resin layer composed of polyimide resin, acrylic resin or epoxy resin can be used.

The isolation section 20 is formed on the surface-emitting type semiconductor laser 140. The isolation section 20 includes a first isolation layer 22 and a second isolation layer 24 formed on the first isolation layer 22. The first isolation layer 22 is a semiconductor layer of a conductivity type different from that of the second mirror 104. More concretely, the first isolation layer 22 may be, for example, an n-type $Al_{0.9}Ga_{0.1}As$ layer. When the first isolation layer 22 and the topmost layer 14 of the second mirror 104 are composed of, for example, AlGaAs (including GaAs), the Al composition of the first isolation layer 22 may be made greater than the Al composition of the topmost layer 14 of the second mirror 104. The second isolation layer 24 is a semiconductor layer of a conductivity type different from that of the first contact layer 111 and the first isolation layer 22. Concretely, the second isolation layer 24 may be, for example, a p-type $Al_{0.9}Ga_{0.1}As$ layer. When the second isolation layer 24 and the first contact layer 111 are composed of, for example, AlGaAs (including GaAs), the Al composition of the second isolation layer 24 can be made greater than the Al composition of the first contact layer 111. The first isolation layer 22, the second isolation layer 24 and the first contact layer 111 may form, for example, a columnar semiconductor laminate (columnar section). The columnar section has a plane configuration that is, for example, a circular shape. The isolation section 20 may function, for example, as a DBR mirror together with the second mirror 104 of the surface-emitting type semiconductor laser section 140.

The second dielectric layer 32 is formed on the second mirror 104 and the first dielectric layer 30. The second dielectric layer 32 is formed in contact with a portion of the side surface of the columnar section composed of the first isolation layer 22, the second isolation layer 24 and the first contact layer 111. A lead-out section 116b and a pad section 116c of the third electrode 116 are formed on the second dielectric layer 32. The second dielectric layer 32 can electrically isolate the third electrode 116 from the second mirror 104. The second dielectric layer 32 may be composed of a material with which micro processing can be readily conducted, compared to the first dielectric layer 30. For example, as the second dielectric layer 32, an inorganic dielectric layer composed of silicon oxide, silicon nitride or the like can be used.

The photodetector section 120 is formed on the isolation section 20. For example, the photodetector section 120 can monitor an output of light generated by the surface-emitting type semiconductor laser 140. The photodetector section 120 includes a first contact layer 111, a photoabsorption layer 112 formed on the first contact layer 111, and a second contact layer 113 formed on the photoabsorption layer 112. More concretely, the first contact layer 111 may be composed of, for example, a GaAs layer, the photoabsorption layer 112 may be composed of, for example, a GaAs layer in which no impurity is doped, and the second contact layer 113 may be composed of, for example, a p-type GaAs layer. The p-type second contact layer 113, the photoabsorption layer 112 in which no impurity is doped, and the n-type first contact layer 111 form a pin diode. The second contact layer 113 and the photoabsorption layer 112 may form, for example, a columnar semiconductor laminate (columnar section). The columnar section has a plane configuration that is, for example, a circular shape.

The third electrode 116 is formed on the first contact layer 111 and the second dielectric layer 32. The third electrode 116 is electrically connected to the first contact layer 111. The third electrode 116 may include a contact section 116a, a lead-out section 116b and a pad section 116c, as shown in FIG. 1. The third electrode 116 is in contact with the first contact layer 111 at the contact section 116a. The contact section 116a of the third electrode 116 has a plane configuration that may be defined by a cut segment of a ring shape, for example, as shown in FIG. 1. The lead-out section 116b of the third electrode 116 connects the contact section 116a with the pad section 116c. The lead-out section 116b has a plane configuration that is, for example, a linear shape shown in FIG. 1. The pad section 116c of the third electrode 116 serves as an electrode pad that is connected to an external wiring or the like. The pad section 116c has a plane configuration that is, for example, a circular shape shown in FIG. 1. The third electrode 116 may be composed of the same material as that of, for example, the first electrode 107.

The fourth electrode 110 is formed on the second contact layer 113 and the third dielectric layer 40. The fourth electrode 110 is electrically connected to the second contact layer 113. The fourth electrode 110 may include a contact section 110a, a lead-out section 110b and a pad section 110c, as shown in FIG. 1. The fourth electrode 110 is in contact with the second contact layer 113 at the contact section 110a. The contact section 110a of the fourth electrode 110 has a plane configuration that may be in a ring shape, for example, as shown in FIG. 1. The contact section 110a has an opening section on the second contact layer 113. The opening section forms an area where the contact section 110a is not formed on the top surface of the second contact layer 113. This area defines, for example, an emission surface 108 for emitting a laser beam. The emission surface 108 has, for example, a circular shape, as shown in FIG. 1. The lead-out section 110b of the fourth electrode 110 connects the contact section 110a with the pad section 110c. The lead-out section 110b has a plane configuration that is, for example, a linear shape shown in FIG. 1. The pad section 110c of the fourth electrode 110 serves as an electrode pad that is connected to an external wiring or the like. The pad section 110c of the fourth electrode 110 has a plane configuration that is, for example, a circular shape shown in FIG. 1. The fourth electrode 110 may be composed of the same material as that of, for example, the second electrode 109.

The first electrode 107, the second electrode 109, the third electrode 116 and the fourth electrode 110 are electrically independent from one another. By this, for example, the surface-emitting type semiconductor laser section 140 and the photodetector section 120 can be driven independently from each other.

The third dielectric layer 40 is formed on the first contact layer 111 and the second dielectric layer 32. The third dielectric layer 40 is formed in a manner to surround the columnar section that is composed of the photoabsorption layer 112 and the second contact layer 113. The lead-out section 110b and the pad section 110c of the fourth electrode 110 are formed on the third dielectric layer 40. The third dielectric layer 40 can electrically isolate the fourth electrode 110 from the first contact layer 111. The third dielectric layer 40 may be composed of a material with which micro processing can be readily conducted, compared to the first dielectric layer 30. For example, as the third dielectric layer 40, an inorganic dielectric layer composed of silicon oxide, silicon nitride or the like can be used.

2. Next, an example of a method for manufacturing the optical device 100 in accordance with an embodiment of the invention is described with reference to the accompanying drawings.

Figure 4:
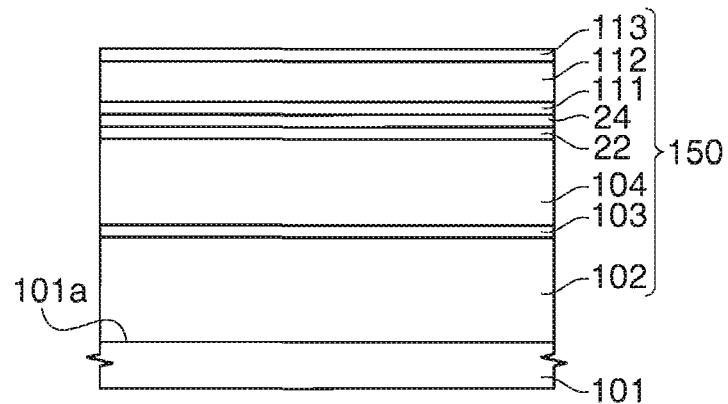
FIG. 4 is a schematic cross-sectional view showing a manufacturing step of manufacturing an optical device in accordance with an embodiment of the invention.
Figure 5:
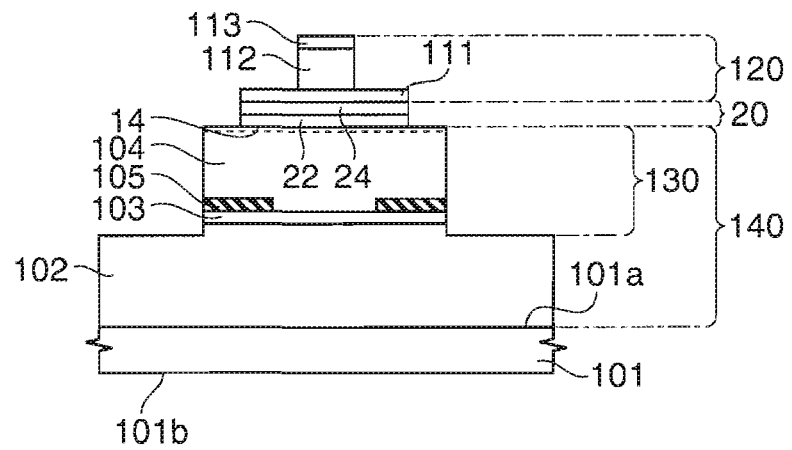
FIG. 5 is a schematic cross-sectional view showing a manufacturing step of manufacturing an optical device in accordance with the embodiment.

FIG. 4 and FIG. 5 are cross-sectional views schematically showing a process for manufacturing the optical device 100 of the present embodiment shown in FIGS. 1-3, and correspond to the cross-sectional view shown in FIG. 2, respectively.

(1) First, as shown in FIG. 4, for example, an n-type GaAs substrate is prepared as a substrate 101. Then, a semiconductor multilayer film 150 is formed on the substrate 101 by epitaxial growth while modifying its composition. The semiconductor multilayer film 150 is formed by successively laminating semiconductor layers that compose a first mirror 102, an active layer 103, a second mirror 104, a first isolation layer 22, a second isolation layer 24, a first contact layer 111, a photoabsorption layer 112, and a second contact layer 113. As impurities that are doped in the respective semiconductor layers, one kind of impurity (for example, carbon) can be used for the p-type, and another kind of impurity (for example, silicon) can be used for the n-type. When the second mirror 104 is grown, at least one layer thereof near the active layer 103 is formed to be a layer that is later oxidized and becomes a current constricting layer 105 For example, when the first isolation layer 22 and the second isolation layer 24 are composed of AlGaAs, the layer that becomes to be the current constricting layer 105 is formed to be, for example, an AlGaAs layer (including an AlAs layer) having an Al composition that is greater than an Al composition of the first isolation layer 22, and greater than an Al composition of the second isolation layer 24. In other words, the Al composition of the first isolation layer 22 and the second isolation layer 24 may preferably be smaller than, for example, the Al composition of the AlGaAs layer that becomes to be the current constricting layer 105. By this, in an oxidizing process for forming the current constricting layer 105 to be described below, the isolation layer 20 is not oxidized. For example, the Al composition of the first isolation layer 22 and the second isolation layer 24 may preferably be less than 0.95, and the Al composition of the AlGaAs layer that becomes to be the current constricting, layer 105 may preferably be greater than 0.95.

(2) Then, as shown in FIG. 5, the semiconductor multilayer film 150 is patterned, thereby forming a first mirror 102, an active layer 103, a second mirror 104, a first isolation layer 22, a second isolation layer 24, a first contact layer 111, a photoabsorption layer 112 and a second contact layer 113 each in a desired configuration. By this, each of the columnar sections is formed. The semiconductor multilayer film 150 may be patterned by using, for example, lithography technique and etching technique. In patterning the first contact layer 111 among the semiconductor multilayer film 150, for example, the second isolation layer 24 provided below the first contact layer 111 can function as an etching stopper layer. Also, in patterning the first isolation layer 22 among the semiconductor multilayer film 150, for example, the topmost layer 14 of the second mirror 104 provided below the first isolation layer 22 can function as an etching stopper layer.

Then, by placing the substrate 101 on which the columnar sections are formed through the aforementioned steps in a water vapor atmosphere, for example, at about 400° C., the layer that becomes to be the aforementioned current constricting layer 105 is oxidized from its side surface, thereby forming the current constricting layer 105.

(3) Next, as shown in FIG. 2 and FIG. 3, a first dielectric layer 30 is formed on the first mirror 102 in a manner to surround the columnar section 130. First, a dielectric layer composed of polyimide resin is formed over the entire surface by using, for example, a spin coat method. Then, the top surface of the columnar section 130 is exposed by using, for example, an etch-back method. Then, the dielectric layer is patterned by, for example, lithography technique and etching technique. In this manner, the first dielectric layer 30 in a desired configuration can be formed.

Then, as shown in FIG. 2 and FIG. 3, a second dielectric layer 32 is formed on the second mirror 104 and the first dielectric layer 30. First, a dielectric layer composed of silicon oxide is formed over the entire surface by using, for example, a plasma CVD method. Then, the dielectric layer is patterned by using, for example, lithography technique and etching technique. In this manner, the second dielectric layer 32 in a desired configuration can be formed. It is easier to conduct fine patterning in this step than fine patterning conducted in the step of forming the first dielectric layer 30.

Then, as shown in FIG. 2 and FIG. 3, a third dielectric layer 40 is formed on the first contact layer 111 and the second dielectric layer 32. First, a dielectric layer composed of silicon oxide is formed over the entire surface by using, for example, a plasma CVD method. Then, the dielectric layer is patterned by using, for example, lithography technique and etching technique. In this manner, the third dielectric layer 40 in a desired configuration can be formed. It is easier to conduct fine patterning in this step than fine patterning conducted in the step of forming the first dielectric layer 30.

Then, a first electrode 107, a second electrode 109, a third electrode 116 and a fourth electrode 110 are formed. The electrodes may be formed in desired configurations, respectively, by, for example, a combination of a vacuum vapor deposition method and a lift-off method, or the like. The order of forming the electrodes is not particularly limited.

(4) By the steps described above, the optical device 100 in accordance with the present embodiment is formed, as shown in FIGS. 1-3.

Figure 6:
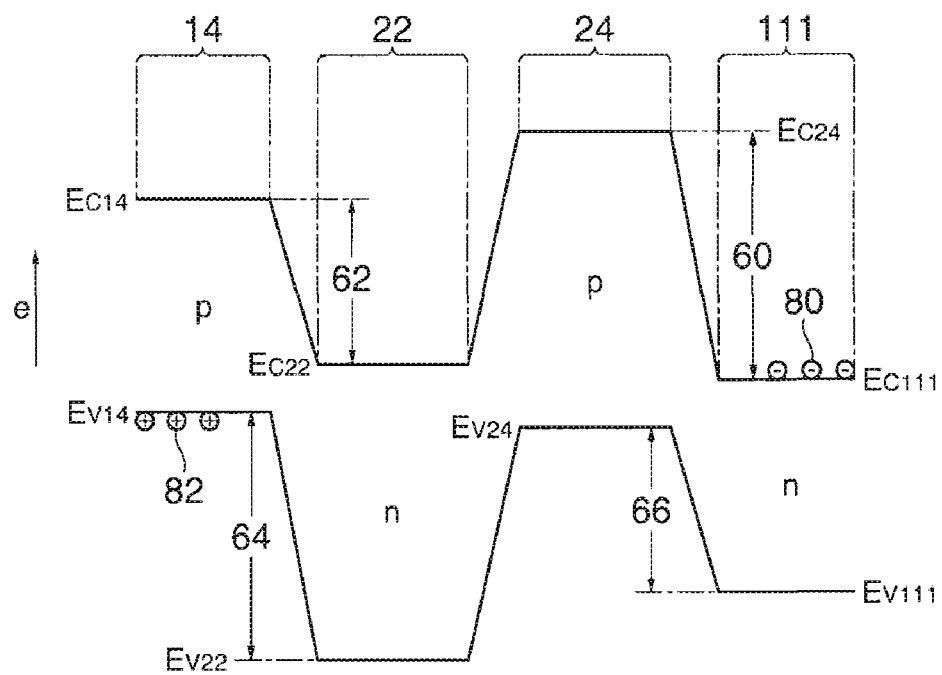
FIG. 6 is an energy band diagram of a main portion of the optical device in accordance with the embodiment.

3. The optical device 100 in accordance with the present embodiment includes the first isolation layer 22 having a conductivity type (for example, n-type) different from that of the second mirror 104, and the second isolation layer 24 having a conductivity type (for example, p-type) different from that of the first contact layer 111 and the first isolation layer 22. FIG. 6 shows an example of an energy band diagram of the main portion of the optical device 100 in accordance with the present embodiment. It is noted that an arrow e indicates the direction in which the energy of electrons becomes greater.

In the optical device 100 in accordance with the present embodiment, as shown in FIG. 6, for example, the energy $Ec_{24}$ at the lower end of the conduction band of the second isolation layer 24 is higher than the energy $Ec_{111}$ at the lower end of the conduction band of the first contact layer 111. Further, for example, the energy $Ec_{22}$ at the lower end of the conduction band of the first isolation layer 22 is lower than the energy $Ec_{24}$ at the lower end of the conduction band of the second isolation layer 24. Also, for example, the energy $Ec_{14}$ at the lower end of the conduction band of the topmost layer 14 of the second mirror 104 is higher than the energy $Ec_{22}$ at the lower end of the conduction band of the first isolation layer 22.

Accordingly, in the optical device 100 in accordance with the present embodiment, when electrons 80, the majority carrier of the n-type first contact layer 111, move to the topmost layer 14 of the second mirror 104, they have to pass over two potential barriers 60 and 62, as shown in FIG. 6. In other words, the first potential barrier 60 formed between the first contact layer 111 and the second isolation layer 24 and the second potential barrier 62 formed between the first isolation layer 22 and the topmost layer 14 of the second mirror 104 exist against the electrons 80 of the first contact layer 111.

Figure 7:
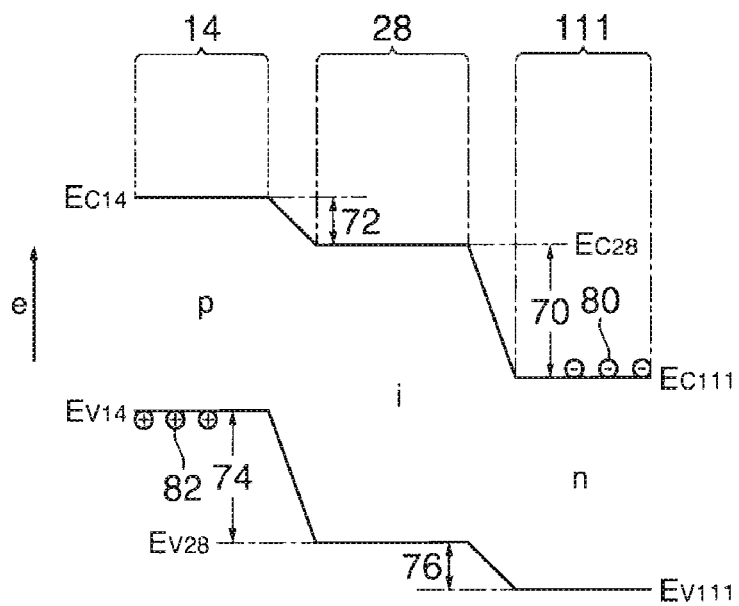
FIG. 7 is an energy band diagram of a main portion of an optical device in accordance with a comparison example.

If the isolation layer 28 composed of intrinsic semiconductor (for example, $Al_{0.9}Ga_{0.1}As$ in which no impurity is doped) alone is provided between the first contact layer 111 and the topmost layer 14 of the second mirror 104 (hereafter referred to as a "comparison example"), its energy band diagram becomes the one shown in FIG. 7. Also in this comparison example, in order for electrons 80 of the first contact layer 111 to move to the topmost layer 14 of the second mirror 104, they are to pass over two potential barriers 70 and 72. However, as shown in FIG. 6 and FIG. 7, the sum of heights of the two potential barriers 60 and 62 of the present embodiment is greater than the sum of heights of the two potential barriers 70 and 72 of the comparison example. This relation can be expressed by the following formula, considering the fact that the sum of heights of the potential barriers 70 and 72 of the comparison example is equal to the difference between the energy $Ec_{14}$ at the lower end of the conduction band of the topmost layer 14 of the second mirror 104 and the energy $Ec_{111}$ at the lower end of the conduction band of the first contact layer 111:

$$|Ec_{14}-Ec_{111}| < |Ec_{24}-Ec_{111}| + |Ec_{14}-Ec_{22}| \tag{1}$$

It is noted that "$|Ec_{24}-Ec_{111}|$" expresses the height of the first potential barrier 60, and "$|Ec_{14}-Ec_{22}|$" expresses the height of the second potential barrier 62.

Because the optical device 100 in accordance with the present embodiment satisfies the formula (1) shown above, migration of electrons from the first contact layer 111 to the topmost layer 14 of the second mirror 104 is made more difficult to occur, compared to the comparison example. Accordingly, leak currents between the surface-emitting type semiconductor laser section 140 and the photodetector section 120 can be reduced, and the reliability of the optical device 100 can be improved.

Also, in the optical device 100 in accordance with the present embodiment, as the second isolation layer 24, for example, a p-type AlGaAs layer may be used, and as the topmost layer 14 of the second mirror 104, for example, a p-type GaAs layer may be used. By this, as shown in FIG. 6, the energy $Ec_{24}$ at the lower end of the conduction band of the second isolation layer 24 can be made higher than the energy $Ec_{14}$ at the lower end of the conduction band of the topmost layer 14 of the second mirror 104. As a result, the height of the first potential barrier 60 can be made greater, and the sum of heights of the two potential barriers 60 and 62 of the present embodiment can consequentially be made much greater, compared to, for example, the case where a p-type GaAs layer is used as the second isolation layer 24.

Furthermore, in the optical device 100 in accordance with the present embodiment, as shown in FIG. 6, for example, the energy $Ev_{22}$ at the upper end of the valence band of the first isolation layer 22 is lower than the energy $Ev_{14}$ at the upper end of the valence band of the topmost layer 14 of the second mirror 104. Moreover, for example, the energy $Ev_{24}$ at the upper end of the valence band of the second isolation layer 24 is higher than the energy $Ev_{22}$ at the upper end of the valence band of the first isolation layer 22. Also, for example, the energy $Ev_{111}$ at the upper end of the valence band of the first contact layer 111 is lower than the energy $Ev_{24}$ at the upper end of the valence band of the second isolation layer 24.

Accordingly, in the optical device 100 in accordance with the present embodiment, when holes 82, the majority carrier of the topmost layer 14 of the p-type second mirror 104, move to the first contact layer 111, they are to pass over two potential barriers 64 and 66, as shown in FIG. 6. In other words, the third potential barrier 64 formed between the topmost layer 14 of the second mirror 104 and the first isolation layer 22 and the fourth potential barrier 66 formed between the second isolation layer 24 and the first contact layer 111 exist against the holes 82 of the topmost layer 14 of the second mirror 104.

Also, in the comparison example described above, in order for holes 82 of the topmost layer 14 of the second mirror 104 to move to the first contact layer 111, they are to pass over two potential barriers 74 and 76, as shown in FIG. 7. However, as shown in FIG. 6 and FIG. 7, the sum of heights of the two potential barriers 64 and 66 of the present embodiment is greater than the sum of heights of the two potential barriers 74 and 76 of the comparison example. This relation can be expressed by the following formula, considering the fact that the sum of heights of the potential barriers 74 and 76 of the comparison example is equal to the difference between the energy $Ev_{14}$ at the upper end of the valence band of the topmost layer 14 of the second mirror 104 and the energy $Ev_{111}$ at the upper end of the valence band of the first contact layer 111:

$$|Ev_{14}-Ev_{111}| < |EV_{14}-EV_{22}| + |EV_{24}-Ev_{111}| \tag{2}$$

It is noted that "$|Ev_{14}-Ev_{22}|$" expresses the height of the third potential barrier 64, and "$|Ev_{24}-Ev_{111}|$" expresses the height of the fourth potential barrier 66.

Because the optical device 100 in accordance with the present embodiment satisfies the formula (2) shown above, migration of holes from the topmost layer 14 of the second mirror 104 to the first contact layer 111 is made more difficult to occur, compared to the comparison example. Accordingly, leak currents between the surface-emitting type semiconductor laser section 140 and the photodetector section 120 can be reduced, and the reliability of the optical device 100 can be improved.

Also, in the optical device 100 in accordance with the present embodiment, as the first isolation layer 22, for example, an n-type AlGaAs layer may be used, and as the first contact layer 111, for example, an n-type GaAs layer may be used. By this, as shown in FIG. 6, the energy $Ev_{22}$ at the upper end of the valence band of the first isolation layer 22 can be made lower than the energy $Ev_{111}$ at the upper end of the valence band of the first contact layer 111. As a result, the height of the third potential barrier 64 can be made greater, and the sum of heights of the two potential barriers 64 and 66 of the present embodiment can consequentially be made much greater, compared to, for example, the case where an n-type GaAs layer is used as the first isolation layer 22.

Furthermore, in accordance with the present embodiment, in the oxidation step of forming the current constricting layer 105, the isolation section 20 can be prevented from being oxidized. As the isolation section 20 is not oxidized, a reduction in the strength and a reduction in the refractive index can be prevented.

4. Next, modified examples of the present embodiment are described. It is noted that, among features different from these of the embodiment described above, only characteristic features are described, and descriptions of the other features may be omitted. Also, members having substantially the same functions as those of the embodiment example described above are appended with the same reference numbers.

(1) First, a first modified example is described.

Figure 8:
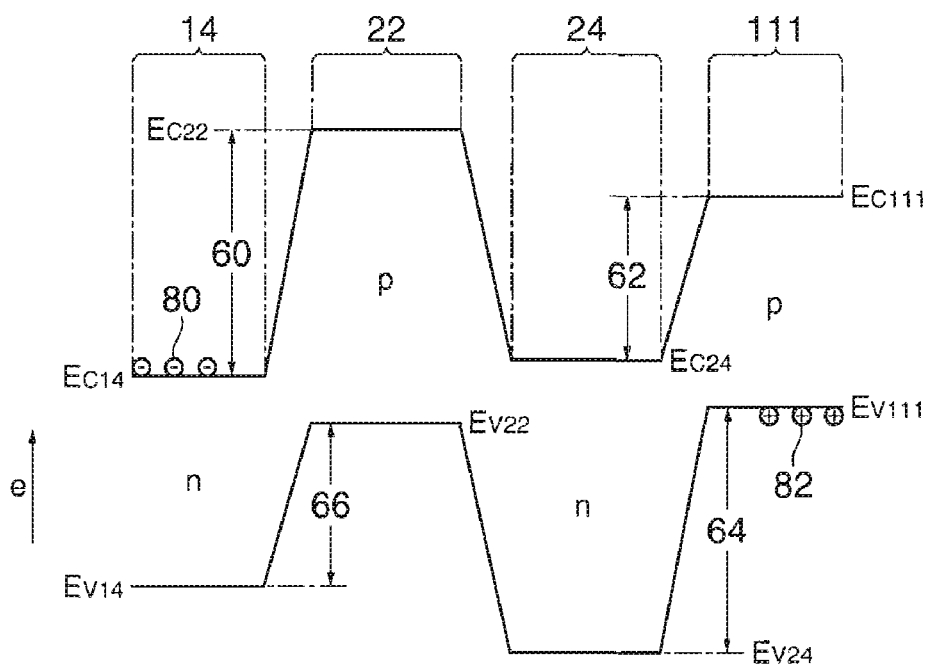
FIG. 8 is an energy band diagram of a main portion of an optical device in accordance with a modified example of the embodiment.

In the first modified example, for example, as shown in FIG. 8, the p-type and n-type characteristics of the semiconductor layers described in the modified example can be interchanged with each other. It is noted that FIG. 8 shows an example of an energy band diagram of the main portion of the optical element 100 in accordance with the first modified example.

Figure 9:
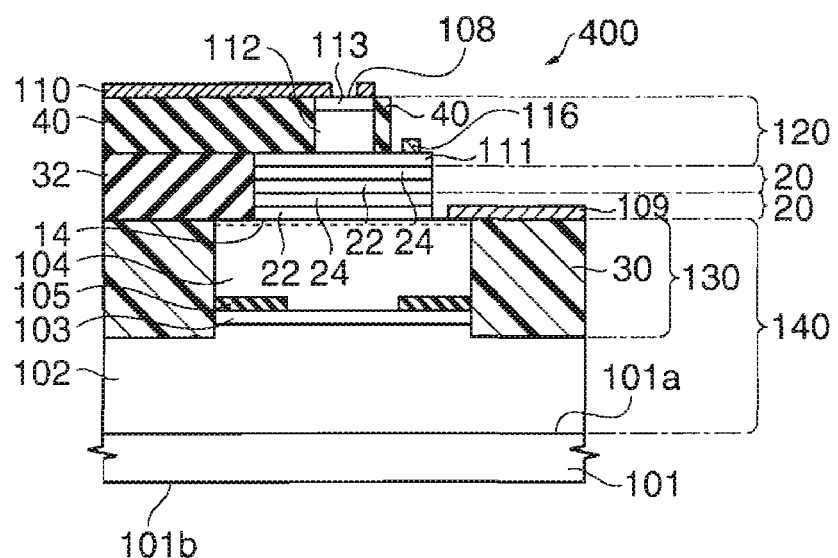
FIG. 9 is a schematic cross-sectional view showing an optical device in accordance with a modified example.

(2) Next, a second modified example is described. FIG. 9 is a cross-sectional view schematically showing an optical device 400 in accordance with the second modified example, and corresponds to the cross-sectional view shown in FIG. 2.

In the example of the optical device 100 (hereafter referred to as the "example of optical device 100") shown in FIGS. 1-3, the case where a single isolation section 20 is provided between the surface-emitting type semiconductor laser section 140 and the photodetector section 120 is described. However, for example, it is possible to provide a plurality of isolation sections 20, as shown in FIG. 9. It is noted that, although two isolation sections 20 are provided in the example shown in FIG. 9, the number of isolation sections is not limited to this example.

Figure 10:
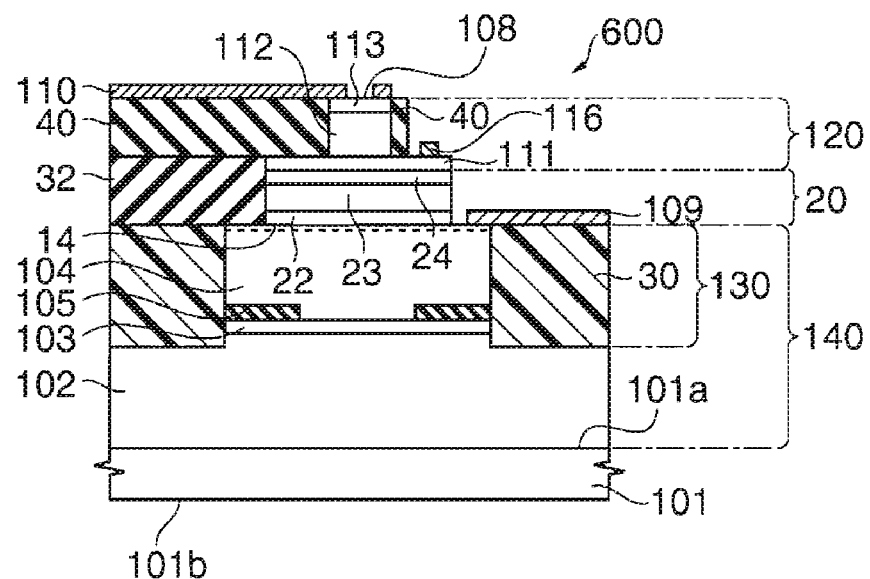
FIG. 10 is an energy band diagram of a main portion of the optical device in accordance with the modified example.

(3) Next, a third modified example is described. FIG. 10 is a cross-sectional view schematically showing an optical device 600 in accordance with the third modified example, and corresponds to the cross-sectional view shown in FIG. 2.

In the present modified example, for example, as shown in FIG. 10, an intrinsic semiconductor layer 23 can be formed between the first isolation layer 22 and the second isolation layer 24. By this, leak currents between the surface-emitting type semiconductor laser section 140 and the photodetector section 120 can be further reduced, and the parasitic capacitance between the surface-emitting type semiconductor laser section 140 and the photodetector section 120 can be reduced. The intrinsic semiconductor layer 23 may be composed of, for example, $Al_{0.9}Ga_{0.1}As$ that is not doped with an impurity.

(4) Next, a fourth modified example is described.

Figure 11:
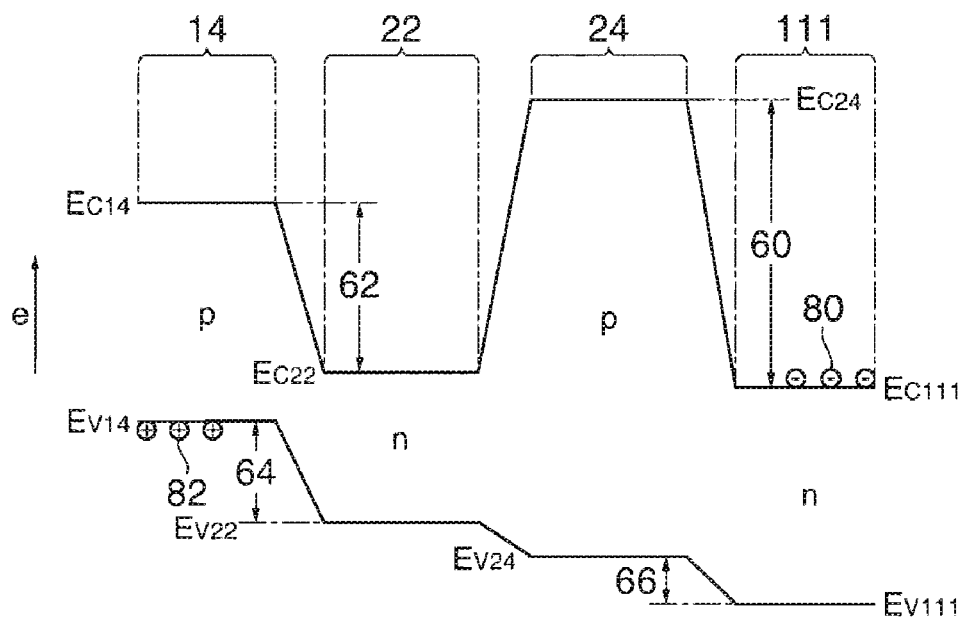
FIG. 11 is an energy band diagram of a main portion of the optical device in accordance with the modified example.

In the present modified example, for example, the energy $Ev_{22}$ at the upper end of the valence band of the first isolation layer 22 can be made higher than the energy $Ev_{24}$ at the upper end of the valence band of the second isolation layer 24. In the present modified example, the aforementioned formula (1) is also satisfied, and therefore leak currents between the surface-emitting type semiconductor laser section 140 and the photodetector section 120 can be reduced, for example, more than the comparison example described above. In the present modified example, the topmost layer 14 of the second mirror 104 may be composed of, for example, p-type $Al_{0.1}Ga_{0.9}As$. Also, the first isolation layer 22 may be composed of, for example, n-type GaAs. Also, the second isolation layer 24 may be composed of, for example, p-type $Al_{0.9}Ga_{0.1}As$. Furthermore, the first contact layer 111 may be composed of, for example, n-type GaAs or n-type $Al_{0.1}Ga_{0.9}As$. It is noted that FIG. 11 shows an example of an energy band diagram of the main portion of the optical device 100 in accordance with the present modified example.

Figure 12:
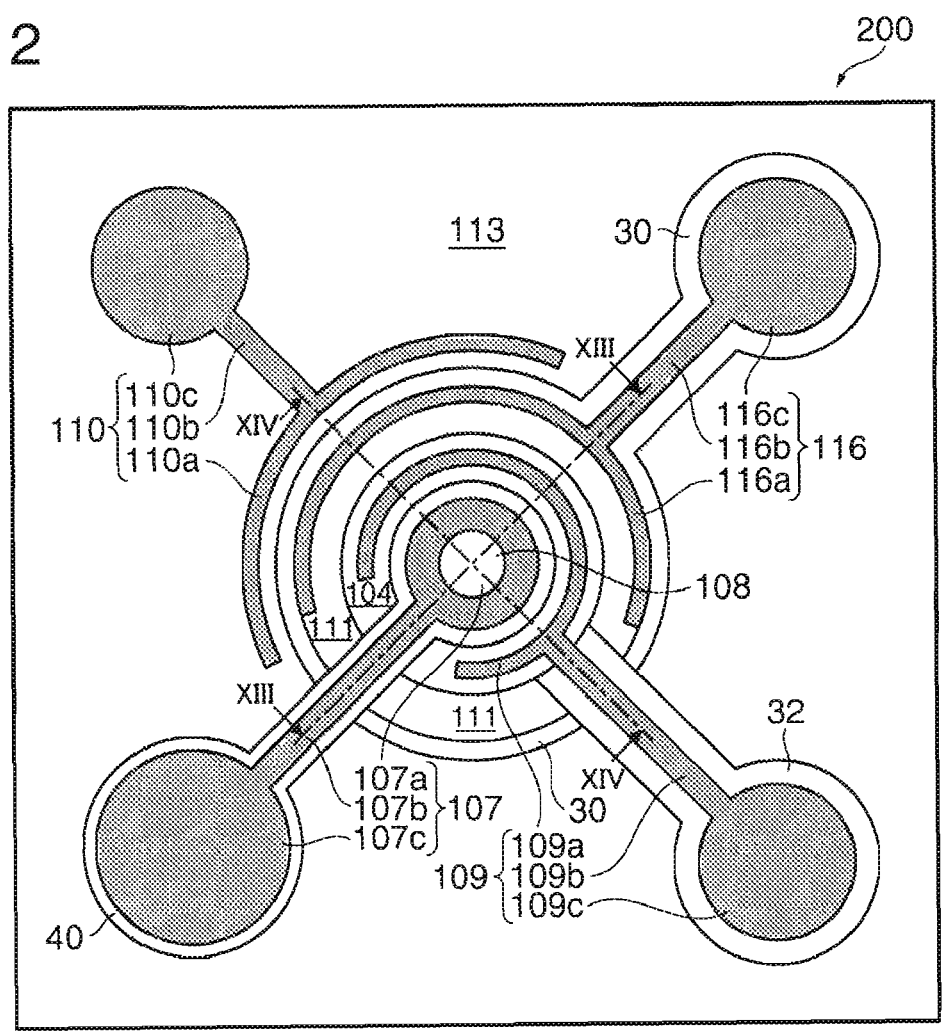
FIG. 12 is a schematic plan view of an optical device in accordance with a modified example.

(5) Next, a fifth modified example is described. FIG. 12 is a plan view schematically showing an optical device 200 in accordance with the fifth modified example, FIG. 13 is a cross-sectional view taken along a line XIII-XIII of FIG. 12, and FIG. 14 is a cross-sectional view taken along a line XIV-XIV of FIG. 12.

In the optical device 100, the surface-emitting type semiconductor laser section 140, the isolation section 20 and the photodetector section 120 are successively laminated in this order on the substrate 101. However, for example, as shown in FIG. 13 and FIG. 14, a photodetector section 120, an isolation section 20 and a surface-emitting type semiconductor laser section 140 may be laminated in this order on a substrate 101. In other words, when viewed from the side of the surface-emitting type semiconductor laser 140, the optical device 200 can include the surface-emitting type semiconductor laser section 140, the isolation section 20 formed on the surface-emitting type semiconductor laser section 140, the photodetector section 120 formed on the isolation section 20 and the substrate 101 formed on the photodetector section 120.

Figure 13:
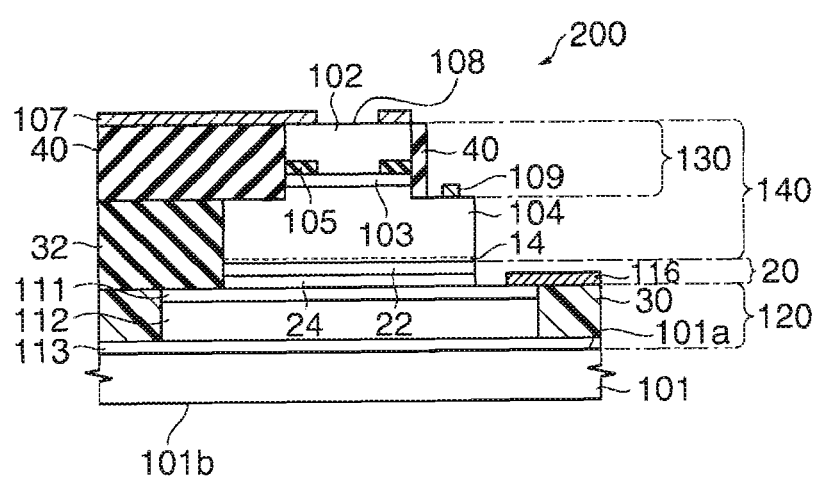
FIG. 13 is a schematic cross-sectional view of the optical device in accordance with the modified example.
Figure 14:
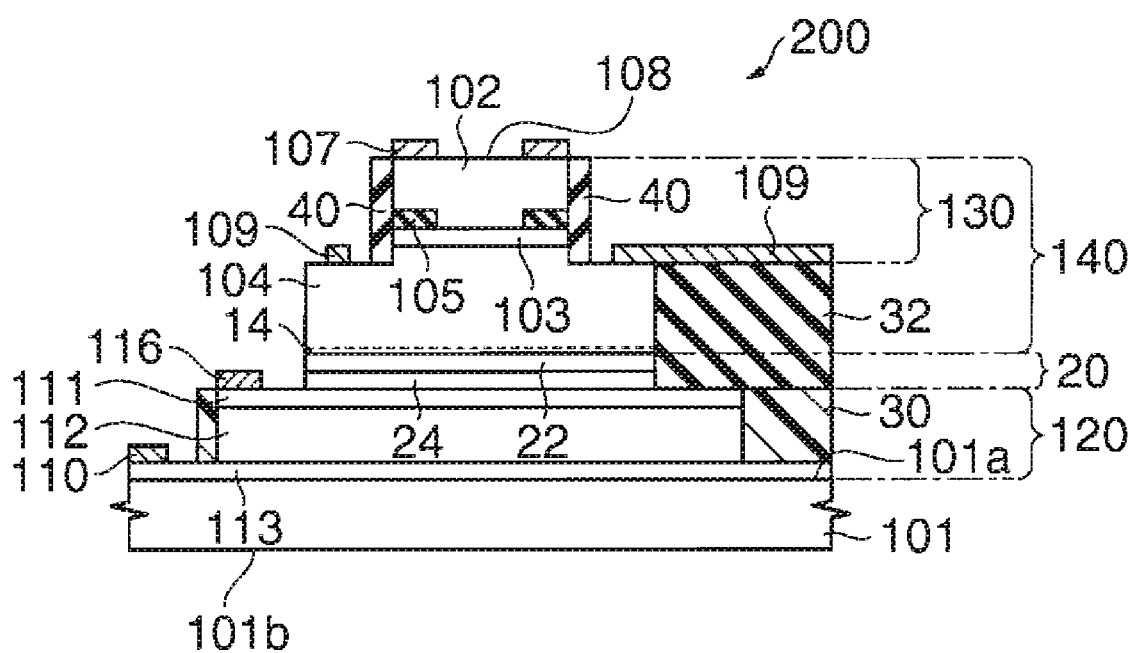
FIG. 14 is a schematic cross-sectional view of the optical device in accordance with the modified example.

In the present modified example, for example as shown in FIG. 13 and FIG. 14, a first dielectric layer 30 is formed on a second contact layer 113, a second dielectric layer 32 is formed on the first dielectric layer 30 and a first contact layer 111, and a third dielectric layer 40 is formed on the second dielectric layer 32 and a second mirror 104. Also, in the present modified example, for example as shown in the figure, at least one layer among the layers composing the first mirror 102 can be formed as a current constricting layer 105.

(6) It is noted that the modified examples described above are examples and the invention is not limited to them. For example, the modified examples may be appropriately combined with one another.

5. Embodiments of the invention are described above in detail. However, a person having an ordinary skill in the art should readily understand that many modifications can be made without departing in substance from the novel matter and effect of the invention. Accordingly, those modified examples are also deemed included in the scope of the invention.

For example, when an epitaxial lift-off (ELO) method is used, the substrate 101 in the optical device 100 can be separated. In other words, the optical device 100 may be provided without the substrate 101.

What is claimed is:
1. An optical device comprising:
a surface-emitting type semiconductor laser section;

at least one isolation section formed above the surface-emitting type semiconductor laser section; and
a photodetector section formed above the isolation section,
wherein the surface-emitting type semiconductor laser section includes a first mirror, an active layer formed above the first mirror and a second mirror, which has a top most layer composed of p-type $Al_{0.1}Ga_{0.9}As$, formed above the active layer,
the photodetector section includes a first contact layer, which is composed of a n-type GaAs or n-type $Al_{0.1}Ga_{0.9}As$, a photoadsorption layer formed above the first contact layer and a second contact layer formed above the photoadsorption layer,
the isolation section includes a first isolation layer composed of n-type GaAs, and a second isolation layer formed above the first isolation layer and composed of p-type $Al_{0.9}Ga_{0.1}As$, and
the energy at an upper end of the valence band of the first isolation layer is higher than the energy at an upper end of the valence band of the second isolation layer.

2. An optical device according to claim 1, further comprising a first electrode electrically connected to the first mirror, a second electrode electrically connected to the second mirror, a third electrode electrically connected to the first contact layer, and a fourth electrode electrically connected to the second contact layer, wherein the first electrode, the second electrode, the third electrode and the fourth electrode are electrically independent from one another.

3. An optical device comprising:
a substrate;
a surface-emitting type semiconductor laser section formed above the substrate;
at least one isolation section formed above the surface-emitting type semiconductor laser section; and
a photodetector section formed above the isolation section,
wherein the surface-emitting type semiconductor laser section includes a first mirror, an active layer formed above the first mirror and a second mirror, which has a top most layer composed of p-type $Al_{0.1}Ga_{0.9}As$, formed above the active layer,
the photodetector section includes a first contact layer, which is composed of a n-type GaAs or n-type $Al_{0.1}Ga_{0.9}As$, a photoabsorption layer formed above the first contact layer and a second contact layer formed above the photoabsorption layer,
the isolation section includes a first isolation layer composed of n-type GaAs, and a second isolation layer formed above the first isolation layer and composed of p-type $Al_{0.9}Ga_{0.1}As$, and
the energy at an upper end of the valence band of the first isolation layer is higher than the energy at an upper end of the valence band of the second isolation layer.

* * * * *